(12) United States Patent
Clawson

(10) Patent No.: US 7,825,010 B2
(45) Date of Patent: Nov. 2, 2010

(54) DIE SINGULATION METHODS

(75) Inventor: Paul Clawson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 739 days.

(21) Appl. No.: 11/759,824

(22) Filed: Jun. 7, 2007

(65) Prior Publication Data

US 2008/0305616 A1    Dec. 11, 2008

(51) Int. Cl.
*H01L 21/00*    (2006.01)
(52) U.S. Cl. ............... 438/464; 438/463; 257/E21.237; 257/E21.238
(58) Field of Classification Search .......... 257/E21.237, 257/E21.238; 438/463, 464
See application file for complete search history.

(56) References Cited

U.S. PATENT DOCUMENTS

| | | | |
|---|---|---|---|
| 6,152,803 | A | 11/2000 | Boucher et al. |
| 6,399,464 | B1 | 6/2002 | Muntifering et al. |
| 6,506,681 | B2 | 1/2003 | Grigg et al. |
| 6,881,648 | B2 | 4/2005 | Chen et al. |
| 7,449,396 | B2 * | 11/2008 | Murata et al. ............... 438/463 |
| 7,629,231 | B2 * | 12/2009 | Maki et al. .................. 438/464 |
| 7,629,251 | B2 | 12/2009 | Hotta et al. |
| 2002/0086452 | A1 | 7/2002 | Kneezel et al. |
| 2002/0192927 | A1* | 12/2002 | Yamada ....................... 438/460 |
| 2004/0121514 | A1* | 6/2004 | Yoo et al. .................... 438/106 |
| 2005/0274702 | A1 | 12/2005 | Deshi |
| 2006/0160269 | A1 | 7/2006 | Rajagopalan et al. |
| 2006/0219351 | A1 | 10/2006 | Kuan et al. |

FOREIGN PATENT DOCUMENTS

JP    2001-223186 A    8/2001

OTHER PUBLICATIONS

Valley Design Corporation, California, "Dicing Services for Hybrids and Semiconductors" http://www.customdicing.com/ (See Encl_0835_Dicing for details).
The 2006-2011 World Outlook for Manufacturing Wafer Processing Equipment, Semiconductor Assembly and Packaging Equipment, and Other Semiconductor Making Machinery http://www.electronics.ca/reports/semicondcutor_manufacturing/ig_wafer_processing.html.
AFWTech, "Wafer Fabrication" http://www.aftwtech.com/tech/wafer-fabrication.html.

(Continued)

*Primary Examiner*—N Drew Richards
*Assistant Examiner*—Yu-Hsi Sun
(74) *Attorney, Agent, or Firm*—Wells St. John P.S.

(57) ABSTRACT

Some embodiments include methods in which a front side region of a semiconductor substrate is placed against a surface. While the front side region is against the surface, the semiconductor substrate is thinned, and then cut into a plurality of dice. The surface may be a pliable material, and may be stretched after the cutting to increase separation between at least some of the dice. While the pliable surface is stretched, at least some of the dice may be picked from the surface. In some embodiments, the semiconductor substrate is retained to the surface with a radiation-curable material. The material is in an uncured and tacky form during the thinning of the substrate, and is subsequently cured into a less tacky form prior to the picking of dice from the surface.

30 Claims, 4 Drawing Sheets

OTHER PUBLICATIONS http://www.parkafm.com/applications/cmp_monitoring "Applications CMP Monitoring" © 2007, Reprinted Jun. 11, 2007, 2 pages.
http://www.fotofab.com "Fotofab Chemical Etching—A Leading Supplier of Mission Critical Thin Metal Parts" © 2003.
http://www.oxfordlasers.com Laser System Specialists © 2007, Oxford Lasers Ltd. Reprinted Jun. 11, 2007 1 page.
http://www.microxact.com Precision Dicing & Engineering Services © 2005 microXact,Inc. Reprinted Jun. 11, 2007, 1 page.

* cited by examiner

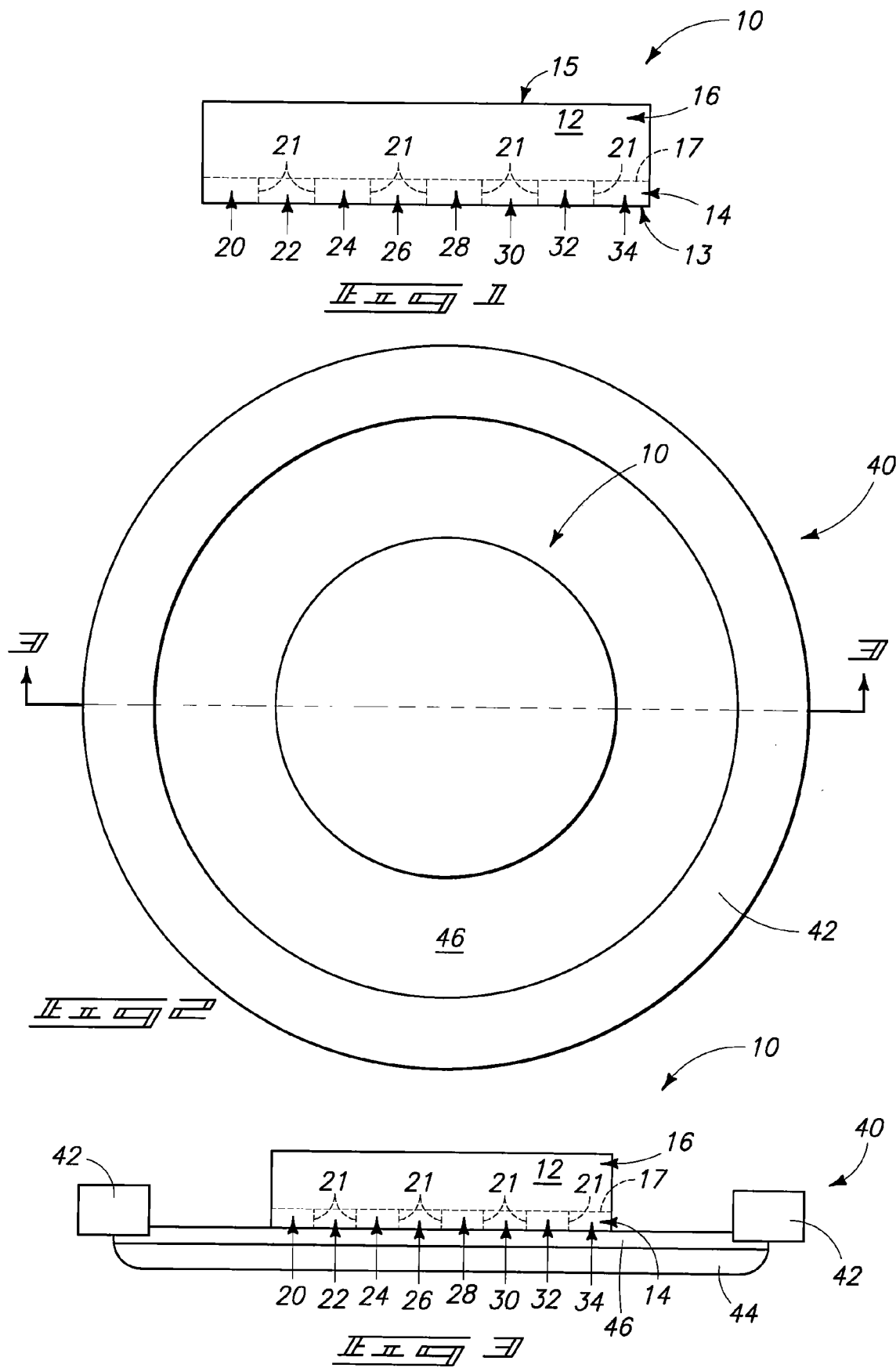

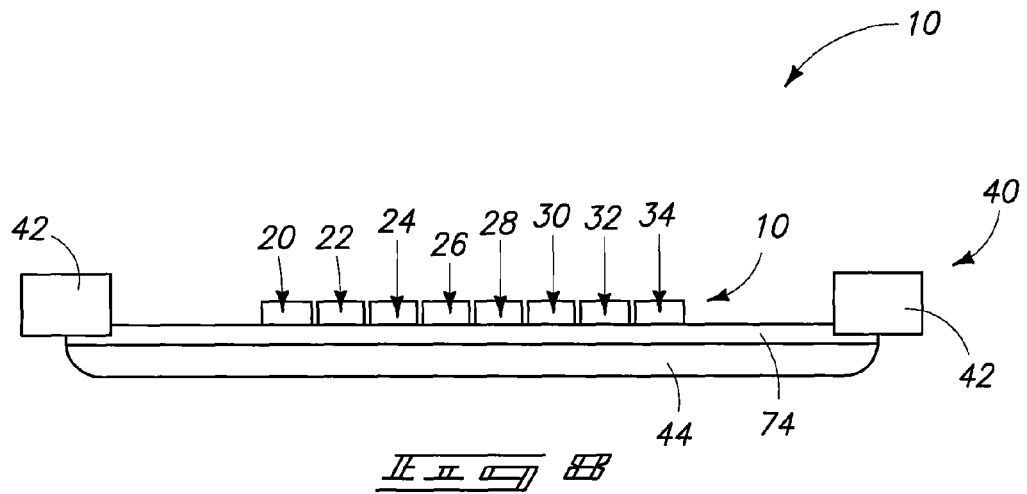
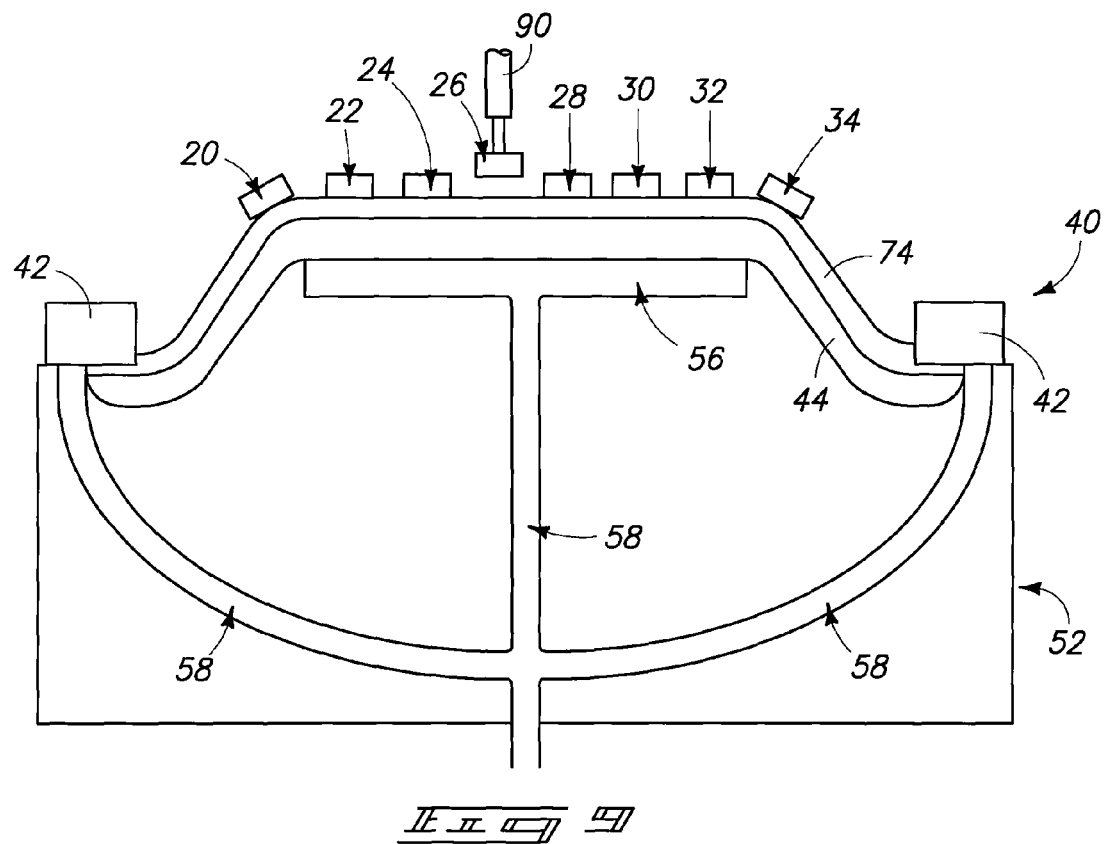

US 7,825,010 B2

DIE SINGULATION METHODS

TECHNICAL FIELD

Die singulation methods.

BACKGROUND

Integrated circuit fabrication may comprise formation of integrated circuitry on and/or within a semiconductor wafer, subsequent singulation of the wafer into a plurality of dice, and finally incorporation of individual die into packages suitable for connecting the die to larger circuits.

The semiconductor wafer may be, for example, a wafer of monocrystalline silicon. The wafer can be considered to have a front side portion, and a back side portion adjacent the front side portion. The integrated circuitry is formed on and/or within the front side portion of the wafer, and subsequently the wafer may be thinned to remove at least some of the back side portion prior to singulation. The thinning may be desired to remove contaminants that may have entered the back side portion during fabrication of circuitry. The thinning may also be desired to reduce the time, expense and difficulty of cutting the wafer during the singulation process, to reduce a die size for packaging constraints, to enhance heat dissipation, etc.

The thinning of the wafer and subsequent singulation of the wafer frequently comprise transfers of the wafer to different devices, and may also comprise flipping of the wafer so that a back side surface is exposed for one device, and a front side surface exposed for a different device. Each transfer of the wafer, and each flip of the wafer, is an additional process step that adds process time and introduces risk of error. Further, multiple consumables may be used during the flipping and transfer. It would be desired to develop new methods for thinning and singulation which reduce wafer transfer and flipping.

BRIEF DESCRIPTION OF THE DRAWINGS

FIG. 1 is a diagrammatic, cross-sectional view of a semiconductor substrate.

FIGS. 2 and 3 are a diagrammatic top view, and a diagrammatic cross-sectional view of the semiconductor substrate of FIG. 1 retained on a carrier. The cross-section of FIG. 3 is along the line 3-3 of FIG. 2.

FIG. 8 is a diagrammatic view of the substrate and carrier of FIG. 3 shown at a processing stage subsequent to that of FIG. 7.

FIG. 9 is a diagrammatic view of an apparatus utilized to stretch a region of the carrier and pick singulated die at a processing stage subsequent to that of either FIG. 6 or FIG. 8.

DETAILED DESCRIPTION OF THE ILLUSTRATED EMBODIMENTS

Figure 4:
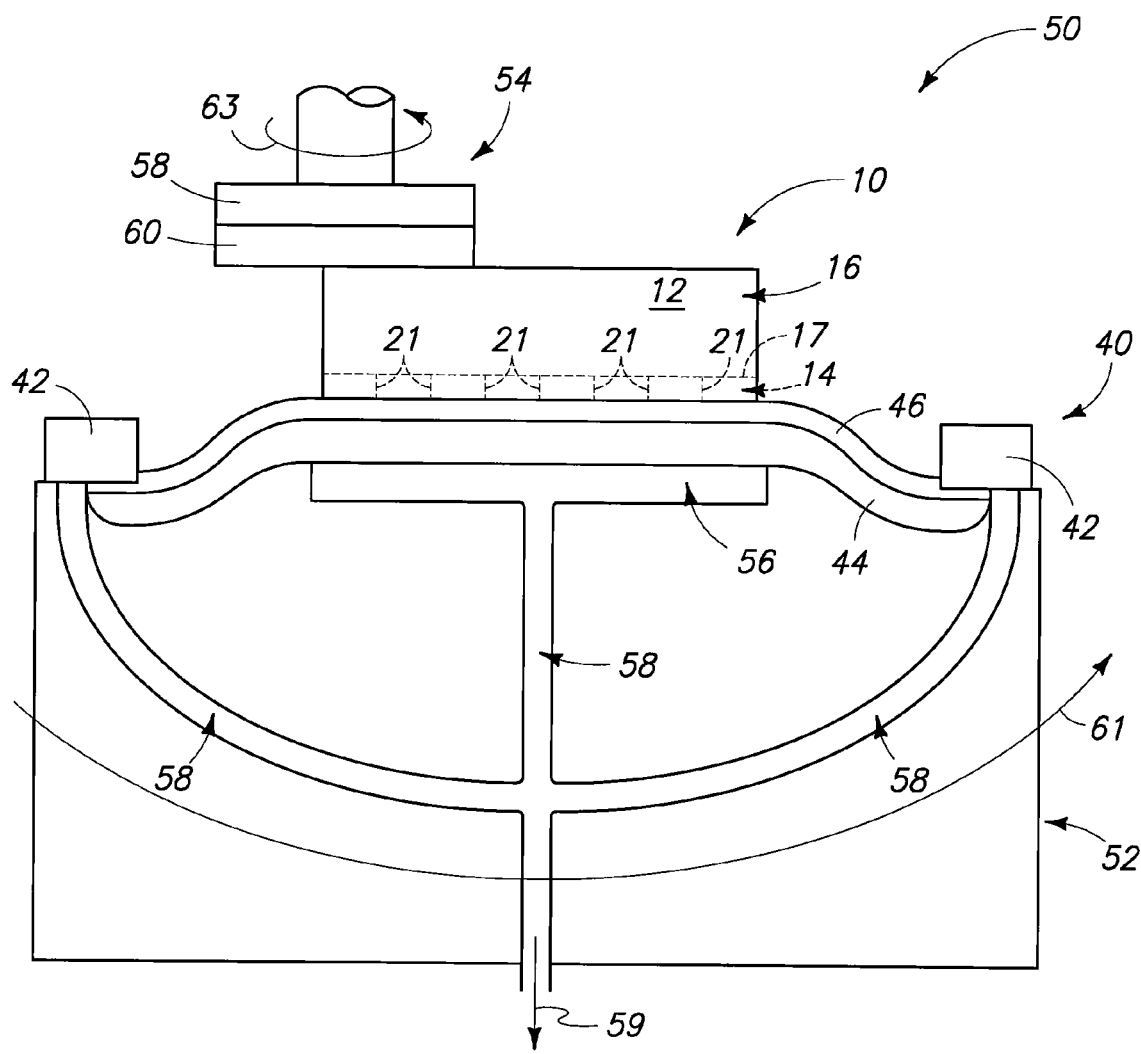
FIG. 4 is a diagrammatic view of a grinding apparatus utilized to treat a substrate retained on a carrier.

In some embodiments, a semiconductor substrate is mounted face down (i.e., front side surface down) on a carrier and then subjected to back side grinding and subsequent dicing (i.e., singulation) while remaining on the carrier. The carrier may include a pliable material, and may be a film frame type carrier. The pliable material may be stretched to spread singulated die from one another prior to the picking of the singulated die from the carrier.

Example embodiments are illustrated in FIGS. 1-9.

Referring to FIG. 1, a semiconductor substrate 10 is diagrammatically illustrated. The substrate comprises a base material 12. Such base material may, for example, comprise, consist essentially of, or consist of monocrystalline silicon. The terms "semiconductive substrate", "semiconductor substrate" and "semiconductor construction" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The semiconductor substrate 10 comprises a front side surface 13 and a back side surface 15 in opposing relation to the front side surface. The substrate may be considered to comprise a front side region 14 proximate the front side surface, and to comprise a back side region 16 proximate the back side surface. A dashed line 17 is provided to represent a boundary between the front side region and the back side region.

The front side region 14 comprises integrated circuitry that is ultimately to be incorporated into dice. Accordingly, the front side region is defined by what it contains rather than by a specific thickness within the substrate. In the shown embodiment, the back side region 16 is thicker than the front side region 14. The relative thickness of the back side region to the front side region will vary depending on the thickness of the substrate and the type of circuitry contained within the front side region.

The front side region 14 is shown subdivided into a plurality of regions 20, 22, 24, 26, 28, 30, 32 and 34; with boundaries between such regions being diagrammatically illustrated with dashed lines 21. The regions 20, 22, 24, 26, 28, 30, 32 and 34 correspond to individual die which are ultimately to be singulated from one another.

Although substrate 10 is shown to be homogenous, it actually comprises numerous layers. Specifically, the semiconductor substrate contains one or more layers associated with integrated circuit fabrication. Such layers may correspond to one or more of metal interconnect layers, barrier layers, diffusion layers, insulator layers, etc. Front side surface 13 may consist of passivation material.

Referring to FIGS. 2 and 3, substrate 10 is mounted to a carrier 40. The carrier comprises an outer ring (or frame) 42 and a material 44 stretched across such ring. The outer ring 40 may be composed of stiff support material (for instance, metal, stiff plastic, etc.). The material 44 may be composed of pliable material (such as, for example, rubber, flexible plastic, fabric etc.). The carrier may be a film frame type carrier in some embodiments.

An adhesive 46 is over material 44 and utilized to retain the front side surface of substrate 10 against material 44. The adhesive may comprise a tacky material, and in some embodiments may comprise a radiation-curable material (such as, for example, a material curable upon exposure to ultraviolet light). In some embodiments, the adhesive 46 and material 44 are together comprised by a tape. In some embodiments, material 44 is a first pliable material, and a second pliable material corresponding to a double-sided tape is adhered to the first pliable material, with an outer surface of the double-sided tape corresponding to adhesive 46.

The carrier and semiconductor substrate are shown to be circular in the top view of FIG. 2, but in other embodiments one or both of the carrier and semiconductor substrate may comprise a different shape.

Referring to FIG. 4, the carrier 40 having semiconductor substrate 10 adhered thereto is placed within a grinding apparatus 50. The apparatus 50 comprises a lower support 52 to which the carrier 40 is mounted, and comprises a grinding wheel 54 above the semiconductor substrate 10.

The lower support 52 comprises a porous pedestal (or chuck) 56 which is directly beneath semiconductor substrate 10. The lower support also comprises an assembly of tubes (or vacuum lines) 58. The tubes are in fluid connection with a pump (not shown) which reduces pressure within the tubes (and pulls through openings, not shown, in the porous pedestal 56) to retain ring 42 and material 44 against the lower support. The reduction of pressure within the tubes is diagrammatically illustrated by arrow 59. The ring 42 may be held in place with one or more clamps (not shown). For instance, four clamps may be used to retain the ring to the lower support.

The grinding wheel 54 comprises a support structure 58 and an abrasive material 60 (e.g., a grinding pad) retained to the support structure.

In operation, one or both of the grinding wheel 54 and lower support 52 is rotated while the grinding wheel contacts the back side region 16 of semiconductor substrate 10. The abrasive surface 60 then abrades material from the back side region of substrate 10 to thin the substrate. In the shown embodiment, an arrow 61 is provided to illustrate rotation of lower support 52, and another arrow 63 is provided to show rotation of grinding wheel 60. The lower support and grinding wheel are both shown to rotate in the same direction as one another, but in other embodiments the grinding wheel may counter-rotate relative to the lower support. The rotation of the lower support rotates the carrier 40 and the semiconductor substrate 10 adhered to such carrier.

The illustrated utilization of a grinding wheel is an example method for removing material from the back side region of semiconductor substrate 10. Other methods may be used in other embodiments. Other methods of abrading material from the back side region of the semiconductor substrate may include impacting the back side surface with particles, ions and/or corrosive chemicals.

Figure 5:
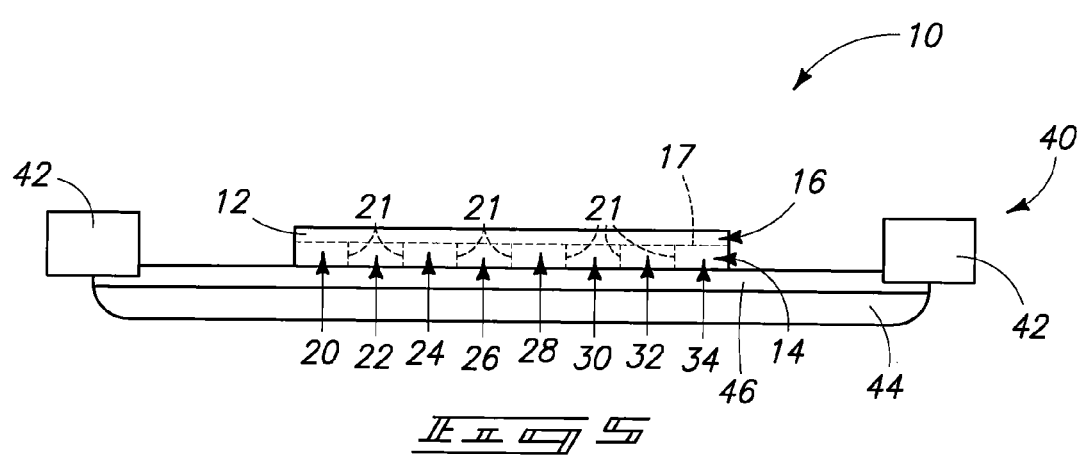
FIG. 5 is a diagrammatic view of the substrate and carrier of FIG. 3 shown at a processing stage subsequent to that of FIG. 4.

FIG. 5 shows semiconductor substrate 10 and carrier 40 after the back side region 16 of the substrate has been thinned by the processing of FIG. 4. In the shown embodiment, some of the back side region remains after the thinning. In other embodiments an entirety of the back side region may be removed by the thinning.

The semiconductor substrate 10 and carrier 40 are shown removed from apparatus 50 at the processing stage of FIG. 5.

In some embodiments, the semiconductor substrate 10 and carrier 40 may remain in apparatus 50 for subsequent processing (discussed below).

Figure 6:
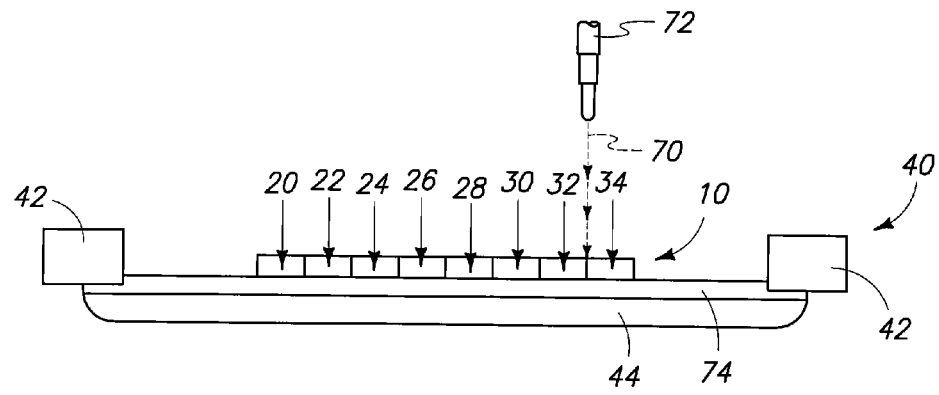
FIG. 6 is a diagrammatic view of the substrate and carrier of FIG. 3 shown at a processing stage subsequent to that of FIG. 5.

Referring to FIG. 6, the dice 20, 22, 24, 26, 28, 30, 32 and 34 are singulated by cutting substrate 10 between the dice (i.e., dicing the substrate). The front side region and the back side region of the dice are not labeled in FIG. 6 in order to simplify the drawing.

The cutting of the semiconductor substrate comprises directing radiation 70 onto the substrate to cause radiative disruption of regions of the substrate impacted by the radiation. The radiation may be, for example, laser light generated by a laser light source 72, and the radiative disruption may comprise, for example, one or more of vaporization, melting or burning. If the radiation corresponds to laser light, the dicing may be considered to comprise laser cutting, and may correspond to so-called zero width kerf wafer dicing.

Adhesive material 46 (FIG. 5) has been treated prior to the processing of FIG. 6 to convert the material to a less adhesive material 74. If material 46 is a UV-curable material, the material may be in an uncured form during the processing of FIG. 4 so that it is tacky, and then may be at least partially cured prior to the processing stage of FIG. 6 so that it becomes the less tacky material 74.

The reduction in tackiness of the adhesive material is to simplify picking of the singulated die from carrier 40. Accordingly, the reduction in tackiness may occur prior to the dicing of FIG. 6, or after such dicing and prior to picking of singulated die (discussed below with reference to FIG. 9). Since radiative cutting of semiconductor substrate 10 induces little or no lateral force on the semiconductor substrate, the conversion of tacky material 46 to less tacky material 74 may occur before the radiative cutting. However, if other cutting methods are utilized which induce lateral force on the semiconductor substrate, the conversion of tacky material 46 to less tacky material 74 may be done after the cutting.

Figure 7:
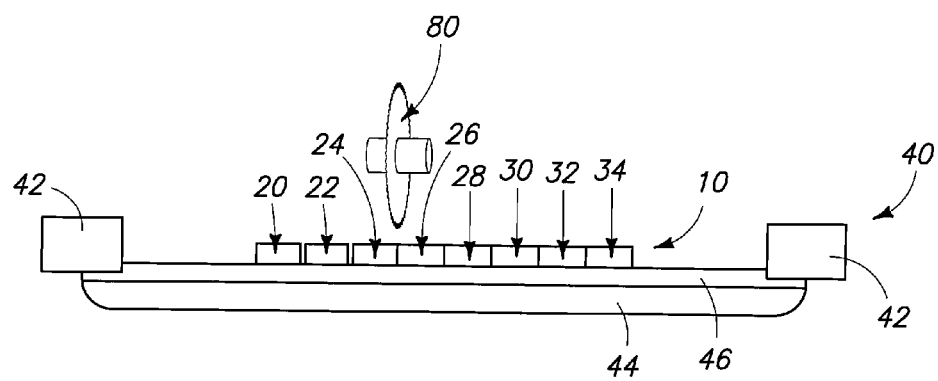
FIG. 7 is a diagrammatic view of the substrate and carrier of FIG. 3 shown at a processing stage subsequent to that of FIG. 5 in accordance with an embodiment alternative that of FIG. 6.

FIG. 7 illustrates a dicing method utilizing a saw 80 to cut semiconductor substrate 10. The saw imparts lateral force on semiconductor substrate 10 during the cutting, and accordingly adhesive 46 remains in a tacky form during such cutting. The illustrated saw is one method of mechanical abrasion that may be utilized for dicing a semiconductor substrate, and other mechanically abrasive methods may be utilized in other embodiments.

FIG. 8 shows semiconductor substrate 10 and carrier 40 after the sawing has singulated all of the dice 20, 22, 24, 26, 28, 30, 32 and 34; and after adhesive 46 (FIG. 7) has been converted to the less tacky form 74.

The processing of FIGS. 6-8 is shown occurring while the carrier and semiconductor substrate are not on the apparatus of FIG. 4. In some embodiments, the carrier and semiconductor substrate may remain on such apparatus during one or both of the conversion of material 46 to the less tacky form 74, and the dicing of substrate 10.

Referring to FIG. 9, carrier 40 is once again illustrated on the lower support 52 (previously described with reference to FIG. 4). The frame 42 is pulled downwardly relative to pedestal 56 to stretch pliable material 44 across the pedestal. The stretching of the pliable material increases separation between at least some singulated dice 20, 22, 24, 26, 28, 30, 32 and 34; and in the shown embodiment increases separation between all of the singulated dice.

The adhesive is shown to be in the less tacky form 74, rather than in the tacky form 46 that had been utilized during the grinding operation of FIG. 4. The adhesive may be converted from the more tacky form 46 to the less tacky form 74 either prior to, or after, the stretching across pedestal 56.

The singulated dice are picked from carrier 40, as illustrated by the die 26 being picked with a device 90. The device 90 may comprise any suitable structure, and may, for example, correspond to a structure configured for vacuum picking. The picked die may be utilized in a semiconductor package, such as, for example, a flip chip package.

In the shown embodiment, the carrier 40 is on the same lower structure 52 during the grinding of FIG. 4 and the picking of FIG. 9. In some embodiments, the carrier may remain on such structure during the dicing (FIG. 5 or alternatively FIG. 7) that occurs between the grinding and the picking. In some embodiments, the carrier may be moved from one apparatus to another so that one or more of the grinding, dicing and picking occurs in a different apparatus than one or more of the others of the grinding, dicing and picking.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A die singulation method, comprising:
   placing a front side region of a semiconductor substrate against a pliable surface; the semiconductor substrate having a back side region adjacent the front side region; the front side region having integrated circuitry formed therein; the pliable surface being over a pedestal;
   while the pliable surface remains over the pedestal and the front side region of the semiconductor substrate is against the pliable surface, removing material from the back side region of the semiconductor substrate to thin the semiconductor substrate;
   while the front side region of the semiconductor substrate is against the pliable surface and the pliable surface is over the pedestal, cutting the semiconductor substrate to separate the semiconductor substrate into a plurality of dice; the cutting occurring after said removing of material from the back side region of the semiconductor substrate;
   stretching the pliable surface over the pedestal to increase separation between at least some of the dice; and
   while the pliable surface is stretched, picking at least some of the dice from the surface.

2. The method of claim 1 wherein a tacky material retains the front side region of the semiconductor substrate to the pliable surface during the removing of material from the back side region.

3. The method of claim 2 wherein the tacky material is a curable material; and further comprising, prior to the picking, reducing the tackiness of the curable material by curing said curable material.

4. The method of claim 3 wherein the curing is conducted after the cutting.

5. The method of claim 4 wherein the cutting comprises mechanical abrasion.

6. The method of claim 4 wherein the cutting comprises sawing.

7. The method of claim 3 wherein the curing is conducted prior to the cutting.

8. The method of claim 7 wherein the cutting comprises directing radiation onto the semiconductor substrate to alter the regions impacted by the radiation.

9. The method of claim 7 wherein the cutting comprises laser cutting.

10. The method of claim 1 wherein the removing of the material from the back side region of the semiconductor substrate comprises spinning the substrate and pliable surface while contacting the back side region of the semiconductor substrate with a grinding surface.

11. A die singulation method, comprising:
    adhering a front side region of a semiconductor substrate to a pliable surface that is over a pedestal; the semiconductor substrate having a back side region adjacent the front side region; the front side region having integrated circuitry formed therein;
    removing material of the adhered semiconductor substrate from the back side region to thin the semiconductor substrate while the pliable surface is over the pedestal;
    after the removing, and while the front side region of the semiconductor substrate remains against the pliable surface, cutting the semiconductor substrate to separate the semiconductor substrate into a plurality of dice;
    stretching the pliable surface over the pedestal to increase separation between at least some of the dice; and
    while the pliable surface is stretched, picking at least some of the dice from the surface.

12. The method of claim 11 wherein the adhesion of the front side region of the semiconductor substrate to the pliable surface is reduced prior to the cutting.

13. The method of claim 12 wherein the front side region of the semiconductor substrate is adhered to the pliable surface with a tacky radiation-curable material, and wherein the reducing adhesion comprises exposing the radiation-curable material to radiation to at least partially cure the radiation-curable material.

14. The method of claim 11 wherein the adhesion of the front side region of the semiconductor substrate to the pliable surface is reduced after the cutting and prior to the picking.

15. The method of claim 14 wherein the front side region of the semiconductor substrate is adhered to the pliable surface with an ultraviolet light curable material, and wherein the reducing adhesion comprises at least partially curing the ultraviolet light curable material.

16. The method of claim 11 wherein the removing material from the back side region comprises grinding.

17. A die singulation method, comprising:
    retaining a semiconductor substrate against a pliable surface that is over a pedestal; the semiconductor substrate having a back side region adjacent a front side region; the front side region having integrated circuitry formed therein;
    abrading the back side region of the retained semiconductor substrate to thin the semiconductor substrate while the pliable surface remains over the pedestal;
    after the abrading, cutting the retained semiconductor substrate to separate the semiconductor substrate into a plurality of dice;
    stretching the pliable surface over the pedestal to increase separation between at least some of the dice; and
    while the pliable surface is stretched, picking at least some of the dice from the pliable surface.

18. The method of claim 17 wherein the pliable surface is part of a carrier.

19. The method of claim 17 wherein the retaining of the semiconductor substrate comprises provision of a tacky material that contacts both the front side region and the surface, the tacky material being a radiation-curable material that becomes less tacky upon curing, the method further comprising curing of the tacky material after the cutting and prior to the picking.

20. The method of claim 17 wherein the retaining of the semiconductor substrate comprises provision of a tacky material that contacts both the front side region and the pliable surface, the tacky material being a radiation-curable material that becomes less tacky upon curing, the method further comprising curing of the tacky material after the stretching and prior to the picking.

21. The method of claim 17 wherein the retaining of the semiconductor substrate comprises provision of a tacky material that contacts both the front side region and the pliable surface, the tacky material being a radiation-curable material that becomes less tacky upon curing, the method further comprising curing of the tacky material prior to the stretching.

22. The method of claim 21 wherein the cutting comprises mechanical abrasion.

23. The method of claim 21 wherein the cutting comprises radiative disruption of regions of the semiconductor substrate.

24. A die singulation method, comprising:
adhering a front side region of a semiconductor substrate to a pliable material over a pedestal; the semiconductor substrate having a back side region adjacent the front side region; the front side region having integrated circuitry formed therein;
spinning the pliable material and adhered semiconductor substrate while the pliable material is over the substrate;
while the semiconductor substrate spins and is over the pedestal, contacting the back side region of the semiconductor substrate with abrasive material to thin the semiconductor substrate;
after thinning the semiconductor substrate, reducing the adhesion between the substrate and the pliable material;
after reducing the adhesion, and while the substrate remains against the pliable material, laser cutting the semiconductor substrate to separate the semiconductor substrate into a plurality of dice;
stretching the pliable material over the pedestal to increase separation between at least some of the dice; and
while the pliable material is stretched, picking at least some of the dice from the pliable material.

25. The method of claim 24 wherein the adhering comprises utilization of a tacky radiation-curable material to retain the front side region of the semiconductor substrate to the pliable material, and wherein the reducing the adhesion comprises at least partially curing the radiation-curable material.

26. A die singulation method, comprising:
adhering a front side region of a semiconductor substrate to a pliable material; the semiconductor substrate having a back side region adjacent the front side region; the front side region having integrated circuitry formed therein; the pliable material being attached to a carrier frame;
spinning the pliable material and adhered semiconductor substrate while the pliable material and the semiconductor substrate are over a pedestal;
while the semiconductor substrate spins and remains over the pedestal, contacting the back side region of the semiconductor substrate with abrasive material to thin the semiconductor substrate;
after thinning the semiconductor substrate, and while the substrate remains adhered to the pliable material, cutting the semiconductor substrate to separate the semiconductor substrate into a plurality of dice;
pulling the carrier frame across the pedestal to stretch the pliable material, the stretching of the pliable material increasing separation between at least some of the dice; and
while the pliable material is stretched, picking at least some of the dice from the pliable material.

27. The method of claim 26 wherein:
the adhering comprises utilization of a tacky radiation-curable material to retain the front side region of the semiconductor substrate to the pliable material;
the adhesion of the front side region of the semiconductor substrate to the pliable material is reduced after the thinning and prior to the picking; and
the reducing of the adhesion comprises at least partially curing the radiation-curable material.

28. The method of claim 27 the adhesion of the front side region of the semiconductor substrate to the pliable material is reduced after the stretching.

29. The method of claim 26 wherein the cutting comprises laser cutting.

30. The method of claim 26 wherein the cutting comprises sawing.

* * * * *